United States Patent
Yoon et al.

(10) Patent No.: US 10,014,173 B2
(45) Date of Patent: Jul. 3, 2018

(54) SINGLE SEMICONDUCTOR CRYSTAL STRUCTURE HAVING AN IMPROVED STRUCTURE FOR CRYSTALLINE LATTICE MISMATCH, SEMICONDUCTOR DEVICE AND METHOD OF MANUFACTURING SAME

(71) Applicant: Samsung Electronics Co., Ltd., Suwon-si (KR)

(72) Inventors: Ji Eon Yoon, Hwaseong-si (KR); Chul Kim, Seongnam-si (KR); Sang Moon Lee, Suwon-si (KR); Seung Ryul Lee, Incheon (KR)

(73) Assignee: SAMSUNG ELECTRONICS CO., LTD., Yeongtong-gu, Suwon-si, Gyeonggi-do (KR)

( * ) Notice: Subject to any disclaimer, the term of this patent is extended or adjusted under 35 U.S.C. 154(b) by 0 days.

(21) Appl. No.: 15/363,139

(22) Filed: Nov. 29, 2016

(65) Prior Publication Data

US 2017/0186609 A1     Jun. 29, 2017

(30) Foreign Application Priority Data

Dec. 29, 2015  (KR) .................. 10-2015-0188778

(51) Int. Cl.
 *H01L 29/32* (2006.01)
 *H01L 21/02* (2006.01)

(52) U.S. Cl.
 CPC .... *H01L 21/02639* (2013.01); *H01L 21/0265* (2013.01); *H01L 21/02381* (2013.01);
 (Continued)

(58) Field of Classification Search
 CPC ... C30B 23/04; C30B 25/04; H01L 21/02507; H01L 21/02656; H01L 21/02634; H01L 21/02639; H01L 21/02647
 (Continued)

(56) References Cited

U.S. PATENT DOCUMENTS

| 4,612,072 A | * | 9/1986 | Morrison | .......... H01L 21/02532 117/106 |
|---|---|---|---|---|
| 4,999,314 A | * | 3/1991 | Pribat | .............. H01L 21/76248 117/106 |

(Continued)

FOREIGN PATENT DOCUMENTS

KR     2015-0059351 A     6/2015

*Primary Examiner* — Victoria K Hall
(74) *Attorney, Agent, or Firm* — Muir Patent Law, PLLC

(57) ABSTRACT

A semiconductor single crystal structure may include a substrate; a defect trapping stack disposed on the substrate; and a semiconductor single crystal disposed on the defect trapping stack, and having a lattice mismatch with a crystal of the substrate, in which the defect trapping stack may include a first dielectric layer disposed on the substrate, and having at least one first opening, a second dielectric layer disposed on the first dielectric layer, and having at least one second opening, a third dielectric layer disposed on the second dielectric layer, and having at least one third opening, and a fourth dielectric layer disposed on the third dielectric layer, and having at least one fourth opening, and in which the semiconductor single crystal may extend to a region of the substrate defined in the at least one first opening through the at least one first to fourth opening.

18 Claims, 11 Drawing Sheets

(52) U.S. Cl.
CPC .. *H01L 21/02521* (2013.01); *H01L 21/02598*
(2013.01); *H01L 21/02647* (2013.01); *H01L*
*29/32* (2013.01); *H01L 21/02532* (2013.01);
*H01L 21/02538* (2013.01); *H01L 21/02642*
(2013.01)

(58) Field of Classification Search
USPC .................. 257/E21.125, 479, E21.131, 190
See application file for complete search history.

(56) References Cited

U.S. PATENT DOCUMENTS

| | | | |
|---|---|---|---|
| 6,312,967 B1 * | 11/2001 | Ikeda | H01L 33/007 257/103 |
| 6,809,351 B2 * | 10/2004 | Kuramoto | C30B 25/02 257/11 |
| 7,494,911 B2 | 2/2009 | Hudait et al. | |
| 7,875,958 B2 | 1/2011 | Cheng et al. | |
| 8,034,697 B2 | 10/2011 | Fiorenza et al. | |
| 8,785,907 B2 | 7/2014 | Goel et al. | |
| 8,796,734 B2 | 8/2014 | Lochtefeld et al. | |
| 9,093,395 B2 * | 7/2015 | Bour | H01L 29/32 |
| 9,735,010 B1 * | 8/2017 | Caimi | H01L 21/02694 |
| 9,748,098 B2 * | 8/2017 | Balakrishnan | H01L 21/02538 |
| 9,748,251 B1 * | 8/2017 | Ogino | H01L 27/1116 |
| 9,768,251 B2 * | 9/2017 | Borg | H01L 29/0657 |
| 9,779,934 B2 * | 10/2017 | Fujikura | H01L 21/0242 |
| 9,786,739 B2 * | 10/2017 | Balakrishnan | H01L 29/0676 |
| 9,837,268 B2 * | 12/2017 | Qi | H01L 21/02532 |
| 9,923,084 B2 * | 3/2018 | Basker | H01L 29/66795 |
| 2001/0039104 A1 * | 11/2001 | Tsuda | H01L 33/007 438/496 |
| 2014/0342536 A1 | 11/2014 | Bai et al. | |
| 2015/0179664 A1 * | 6/2015 | Levander | H01L 21/02002 257/76 |
| 2017/0294307 A1 * | 10/2017 | Caimi | H01L 21/02639 |

* cited by examiner

SINGLE SEMICONDUCTOR CRYSTAL STRUCTURE HAVING AN IMPROVED STRUCTURE FOR CRYSTALLINE LATTICE MISMATCH, SEMICONDUCTOR DEVICE AND METHOD OF MANUFACTURING SAME

CROSS-REFERENCE TO RELATED APPLICATION

This application claims the benefit of priority under 35 U.S.C. § 119 to Korean Patent Application No. 10-2015-0188778, filed on Dec. 29, 2015, in the Korean Intellectual Property Office, the disclosure of which is incorporated herein by reference in its entirety.

BACKGROUND

Field

The present disclosure relates to a semiconductor single crystal and, more particularly, a single heterojunction semiconductor crystal and a semiconductor device having the same.

Description of Related Art

Recently, research is being actively conducted into manufacturing semiconductor devices, such as a high-speed, high-current CMOS using SiGe or a III-V group compound semiconductor having high mobility that replaces conventional silicon (Si). Because the cost and price of a single crystal substrate formed of such a compound semiconductor is higher than that of a single crystal substrate formed of Si, the growth of a single heterojunction semiconductor crystal using the single crystal substrate formed of such a compound semiconductor as a growth substrate is economically disadvantageous.

However, such growth of a single heterojunction semiconductor crystal may cause crystal defects due to lattice mismatch with a substrate, leading to difficulty obtaining high-quality crystals. Because of such crystal defects, a single heterojunction semiconductor crystal may cause a significant leakage current or deterioration when used as an active region such as a channel layer of a semiconductor device.

SUMMARY

An aspect of an example embodiment may provide a method of growing a high-quality single heterojunction semiconductor crystal using a substrate such as a silicon (Si) substrate. Another aspect of an example embodiment may provide various types of semiconductor device technologies using the method.

According to an example embodiment, the disclosure is directed to a semiconductor single crystal structure comprising: a substrate; a defect trapping stack disposed on the substrate; and a semiconductor single crystal disposed on the defect trapping stack, and having a lattice mismatch with a crystal of the substrate, wherein the defect trapping stack includes: a first dielectric layer disposed on the substrate and having at least one first opening, the at least one first opening having a first width, a second dielectric layer disposed on the first dielectric layer and having at least one second opening positioned on the at least one first opening, the at least one second opening having a second width less than the first width, a third dielectric layer disposed on the second dielectric layer and having at least one third opening positioned on the at least one second opening, the at least one third opening having a third width greater than the second width, and a fourth dielectric layer disposed on the third dielectric layer and having at least one fourth opening positioned on the at least one third opening while not overlapping the at least one second opening, the at least one fourth opening having a fourth width less than the third width, and wherein the semiconductor single crystal extends to a region of the substrate defined by the at least one first opening through the at least one fourth opening, the at least one third opening, the at least one second opening, and the at least one first opening.

According to another example embodiment, the disclosure is directed to a semiconductor device comprising: a substrate; a first dielectric layer disposed on the substrate and having at least one first opening, the at least one first opening having a first width; a second dielectric layer disposed on the first dielectric layer and having at least one second opening positioned on the at least one first opening, the at least one second opening having a second width less than the first width; a third dielectric layer disposed on the second dielectric layer and having at least one third opening positioned on the at least one second opening, and the at least one third opening having a third width greater than the second width; a fourth dielectric layer disposed on the third dielectric layer and having at least one fourth opening positioned on the at least one third opening without overlapping the at least one second opening, the at least one fourth opening having a fourth width less than the third width; and a semiconductor single crystal disposed on an upper surface of the fourth dielectric layer and extending to a region of the substrate defined by the at least one first opening through the at least one fourth opening, the at least one third opening, the at least one second opening, and the at least one first opening, wherein the semiconductor single crystal has a lattice mismatch with a crystal of the substrate.

According to another example embodiment, the disclosure is directed to a semiconductor device comprising: a substrate; a first dielectric layer disposed on the substrate and having at least one first trapping opening having a first width; a second dielectric layer disposed on the first dielectric layer and having at least one connecting opening positioned on the at least one first trapping opening, the at least one connecting opening having a second width greater than the first width of the at least one first trapping opening; a third dielectric layer disposed on the second dielectric layer and having at least one second trapping opening positioned on the at least one connecting opening without overlapping the at least one first trapping opening, the at least one second trapping opening having a third width less than the second width of the at least one connecting opening; and a semiconductor single crystal extending from a region of the substrate defined in the at least one first trapping opening to an upper surface of the third dielectric layer through the at least one first trapping opening, the at least one connecting opening, and the at least one second trapping opening, wherein the semiconductor single crystal has a lattice mismatch with a crystal of the substrate.

According to another example embodiment, the disclosure is directed to a method of manufacturing a semiconductor single crystal comprising: forming a first dielectric layer on a substrate; forming a second dielectric layer on the first dielectric layer; forming at least one first trapping opening in the second dielectric layer to expose a region of the first dielectric layer; forming a third dielectric layer on the second dielectric layer; forming a fourth dielectric layer on the third dielectric layer; forming at least one second trapping opening in the fourth dielectric layer to not overlap the at least one first trapping opening; selectively etching the third dielectric layer and the first dielectric layer through the at least one second trapping opening, whereby at least one connecting opening extending to the at least one first trapping opening is formed in the third dielectric layer, and at least one growth opening exposing a region of the substrate is formed in the first dielectric layer while the at least one first trapping opening is opened; and growing a semiconductor single crystal extending from the region of the substrate defined in the at least one growth opening to an upper surface of the fourth dielectric layer through the at least one growth opening, the at least one first trapping opening, the at least one connecting opening, and the at least one second trapping opening, wherein the semiconductor single crystal has a lattice mismatch with a crystal of the substrate.

According to another example embodiment, the disclosure is directed to a semiconductor single crystal structure comprising: a substrate; a defect trapping stack disposed on the substrate; and a semiconductor single crystal disposed on the defect trapping stack, and having a lattice mismatch with a crystal of the substrate, wherein the defect trapping stack includes: a first dielectric layer disposed on the substrate and having at least one first opening, the at least one first opening having a first width, a second dielectric layer disposed on the first dielectric layer and having at least one second opening positioned on the at least one first opening, the at least one second opening having a second width less than the first width, a third dielectric layer disposed on the second dielectric layer and having at least one third opening positioned on the at least one second opening without overlapping the at least one first opening, the at least one third opening having a third width greater than the second width, and wherein the semiconductor single crystal extends to a region of the substrate defined by the at least one first opening through the at least one third opening, the at least one second opening, and the at least one first opening.

BRIEF DESCRIPTION OF DRAWINGS

The above and other aspects, features, and advantages of the present disclosure will be more clearly understood from the following detailed description taken in conjunction with the accompanying drawings, in which.

DETAILED DESCRIPTION

Hereinafter, embodiments of the present disclosure will be described as follows with reference to the attached drawings.

Figure 1:
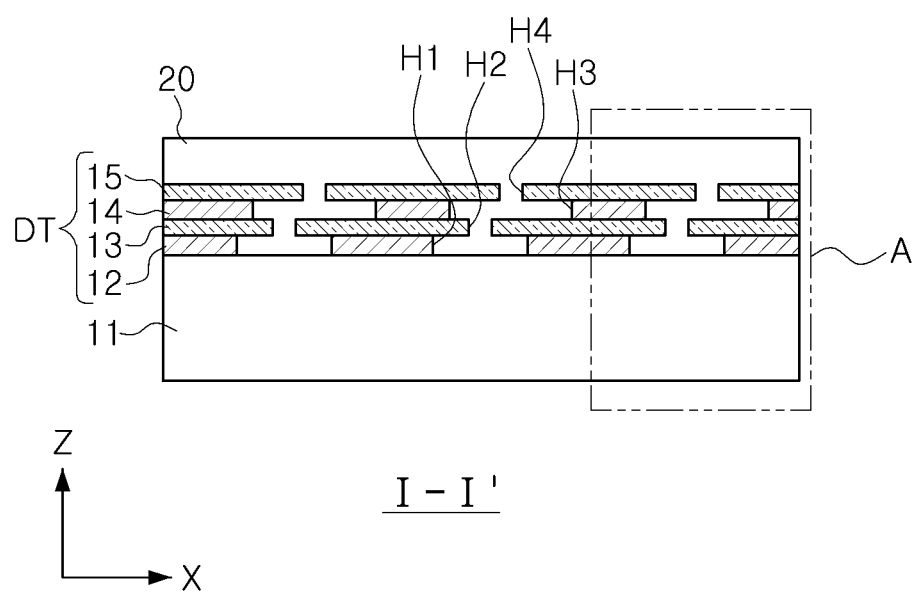
FIG. 1 is a schematic cross-sectional view of a semiconductor single crystal structure according to an example embodiment.

FIG. 1 is a schematic cross-sectional view of a semiconductor single crystal structure according to an example embodiment.

Referring to FIG. 1, a semiconductor single crystal structure may be a heterojunction structure, and may include a substrate 11, a defect trapping stack DT disposed on the substrate 11, and a semiconductor single crystal 20 disposed on the defect trapping stack DT.

The semiconductor single crystal 20 may have a different lattice constant than the lattice constant of the crystal of the substrate 11 that it contacts and thus have a lattice mismatch with the crystal of the substrate 11. The lattice constant of the semiconductor single crystal 20 may be larger or smaller than the lattice constant of the crystal. The substrate 11 may comprise crystalline silicon (Si), crystalline germanium (Ge), or crystalline sapphire ($Al_2O_3$). The semiconductor single crystal 20 may be a compound semiconductor. For example, the semiconductor single crystal 20 may include a compound semiconductor such as Silicon-Germanium (SiGe), or a III-V group compound semiconductor (including binary, ternary, and quaternary forms), such as, for example, GaAs, InGaAs, InAs, InSb, and GaN. A defect trapping stack DT employed in the example embodiments may include first to fourth dielectric layers 12, 13, 14, and 15 sequentially disposed on the substrate 11. The first to fourth dielectric layers 12, 13, 14, and 15 may include first to fourth openings H1, H2, H3, and H4, respectively. For example, the fourth dielectric layer 15 may include the fourth opening H4 and may be stacked on the third dielectric layer 14. The third dielectric layer 14 may include the third opening H3 and may be stacked on the second dielectric layer 13. The second dielectric layer 13 may include the second opening H2 and may be stacked on the first dielectric layer 12. The first dielectric layer 12 may include the first opening H1 and may be stacked on the substrate 11.

Figure 2:
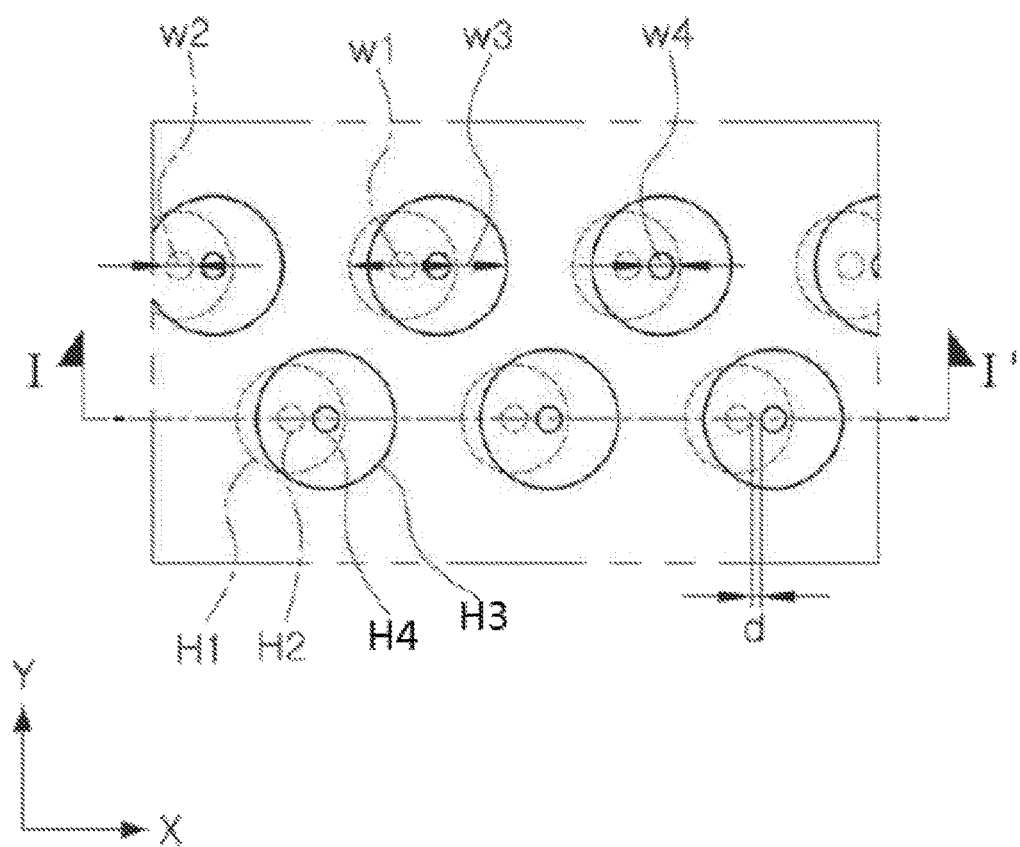
FIG. 2 is a schematic plan view of a defect trapping stack employed in FIG. 1.
Figure 7:
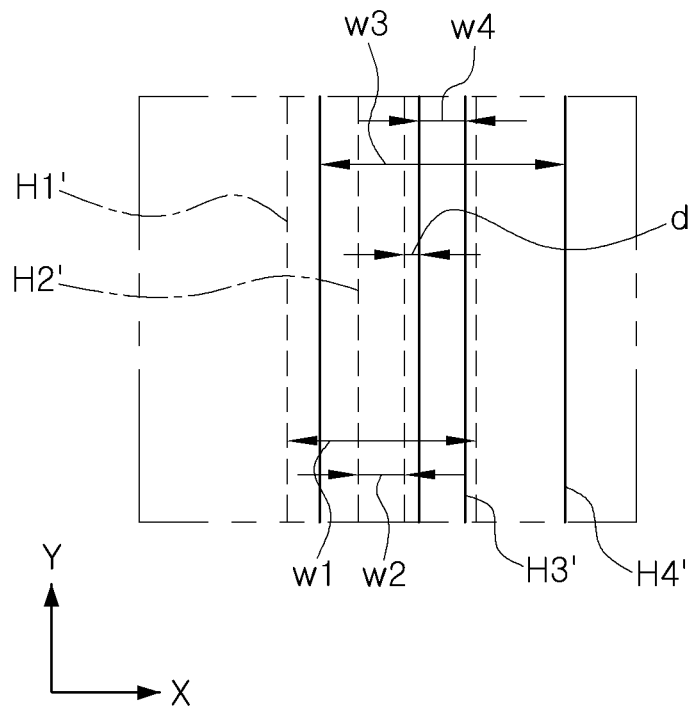
FIGS. 7 and 8 are schematic plan views of other defect trapping stacks employable in FIG. 1, respectively.
Figure 8:
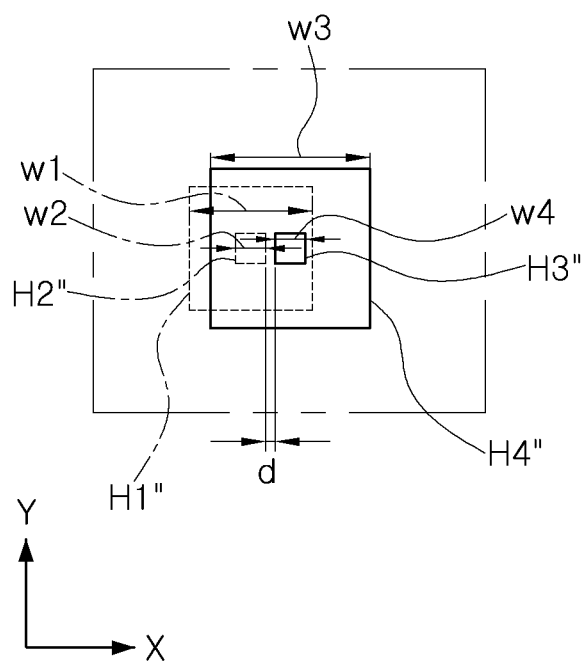

FIG. 2 is a schematic plan view illustrating an example of the defect trapping stack DT employed in FIG. 1. FIG. 2 illustrates an opening pattern of the defect trapping stack DT (the first opening H1 and the second opening H2 each are illustrated by a dotted line, and the third opening H3 and the fourth opening H4 each are illustrated by a solid line.). The first to fourth openings H1, H2, H3, and H4 are illustrated as being substantially circular, but the embodiments are not limited thereto. For example, FIGS. 7 and 8 illustrate embodiments in which the first to fourth openings H1, H2, H3, and H4 are polygonal (e.g., rectangular, square, etc.).

Referring to FIGS. 1 and 2, the first opening H1 of the first dielectric layer 12 may define a region in which the semiconductor single crystal 20 is to be grown on an upper surface of the substrate 11. The second opening H2 of the second dielectric layer 13 may be disposed on the first opening H1 and may be connected to the first opening H1. The second opening H2 is not limited thereto, and as illustrated in FIG. 2, the second opening H2 may be positioned substantially in the center of the first opening H1. For example, the second opening H2 may be positioned such that a central area of the second opening H2 is positioned over and aligned with a central area of the first opening H1. As used herein, features and/or elements described herein as "connected" may be arranged such that crystal growth or spread will follow a path between the features and/or elements.

In the exemplary embodiment of FIG. 2, the first to fourth openings H1, H2, H3, and H4 may have respective widths w1, w2, w3, and w4 that reflect a diameter of the corresponding first to fourth openings H1, H2, H3, and H4. A width w2 of the second opening H2 may be less than a width w1 of the first opening H1. The second opening H2 may be provided to trap crystal defects. In more detail, an aspect ratio of the second opening H2 may be determined to block potential defects spreading in a growth direction of the semiconductor single crystal 20 (particularly, a direction inclined on the upper surface of the substrate 11) by an internal side wall of the second opening H2. In some embodiments, to improve such a defect trapping effect, the second opening H2 may have an aspect ratio of about 2.0 or more (the aspect ratio representing a ratio of the height of an opening to a width of the opening). This will be described in more detail with reference to FIGS. 3 and 4.

The third opening H3 of the third dielectric layer 14 may be disposed on the second opening H2 and may be connected to the second opening H2. Similarly, the fourth opening H4 of the fourth dielectric layer 15 may be disposed on the third opening H3 and may be connected to the third opening H3. The fourth opening H4 is not limited thereto, and as illustrated in FIG. 2, the fourth opening H4 may be positioned substantially in the center of the third opening H3. For example, the fourth opening H4 may be positioned such that a central area of the fourth opening H4 is positioned over and aligned with a central area of the third opening H3. A width w3 of the third opening H3 may be less than the width w2 of the second opening H2 and a width w4 of the fourth opening H4.

The third opening H3 may provide a void connecting the second opening H2 to the fourth opening H4. A single crystal grown from the second opening H2 may be developed in the fourth opening H4 while expanding in the third opening H3 in a lateral direction thereof.

The width w4 of the fourth opening H4 may be less than the width w3 of the third opening H3, and the fourth opening H4 may be positioned to not overlap the second opening H2 when viewed from a plan view. As such, an arrangement in which the fourth opening H4 and the second opening H2 do not overlap each other may effectively prevent further spread of a crystal defect that has spread in a substantially vertical direction (e.g., Z-direction). As used herein, the phrase "not overlap" may mean that the second opening H2 and the fourth opening H4 may be spaced apart from each other at an interval d in a horizontal direction (e.g., an X- and/or Y-direction) and center lines of the second opening H2 and the fourth opening H4 may not correspond to each other when viewed in a plan view, such as is illustrated in FIG. 2.

For example, the first to fourth dielectric layers 12, 13, 14, and 15 may be a silicon oxide ($SiO_2$), a silicon nitride ($Si_3N_4$), or an aluminum oxide ($Al_2O_3$). The first dielectric layer 12 and the third dielectric layer 14 may include a first material. The second dielectric layer 13 and the fourth dielectric layer 15 may include a second material different from the first material. The second material may have a high etching selectivity ratio compared to the first material under certain etching process conditions. The second material is not limited thereto, and for example, each of the respective first to fourth dielectric layers 12, 13, 14, and 15 may include different materials, respectively.

As illustrated in FIGS. 1 and 2, a size (or a volume) of the third opening H3 may be greater than that of the first opening H1. For example, when thicknesses and materials of the second dielectric layer 13 and the fourth dielectric layer 15 are the same or similar to each other, the width w3 of the third opening H3 may be greater than the width w1 of the first opening H1.

The first to fourth openings H1, H2, H3, and H4 employed in the example embodiments are provided in plural, respectively, and as illustrated in FIG. 2, may be arranged in the respective first to fourth dielectric layers 12, 13, 14, and 15 with repeating patterns. In this case, the repeated patterns of the first to fourth openings H1, H2, H3, and H4 may be arranged at regular intervals, respectively. The first to fourth openings H1, H2, H3, and H4 are not limited thereto, and as desired, may each be employed in a number of one or more.

The action and effect of the defect trapping stack DT employed in the example embodiment will hereinafter be described in more detail with reference to FIGS. 3 through 6. FIGS. 3 through 6 are enlarged views of region A of FIG. 1, and schematically illustrate a process of growing a semiconductor single crystal.

Figure 3:
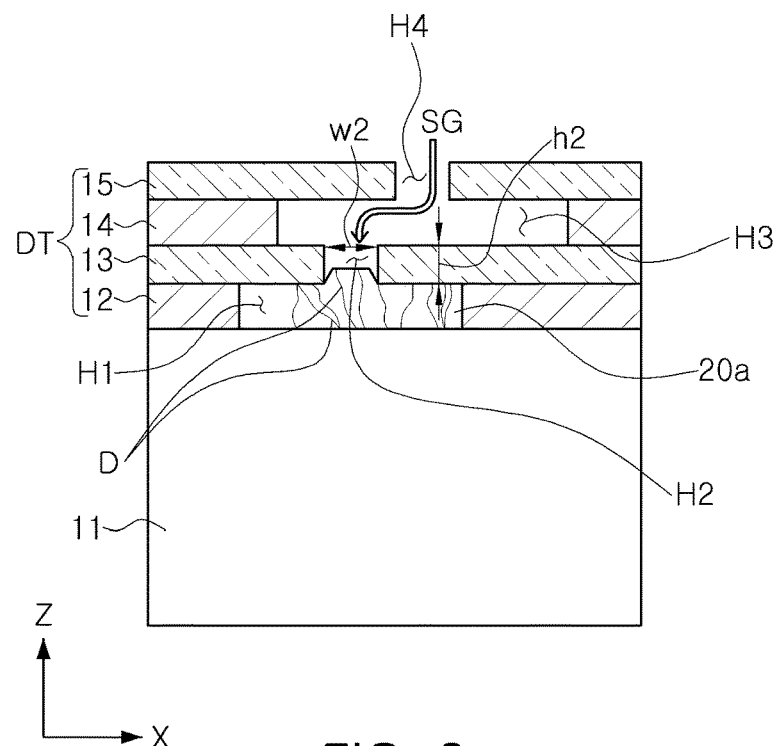
FIGS. 3 through 6 are mimetic diagrams of a semiconductor single crystal growth process, respectively.

As illustrated in FIG. 3, the defect trapping stack DT may include the first to fourth dielectric layers 12, 13, 14, and 15 sequentially disposed on the substrate 11. The first to fourth openings H1, H2, H3, and H4, respectively provided in the first to fourth dielectric layers 12, 13, 14, and 15, may be connected to each other as described above.

In a process chamber, a source gas SG may be supplied through the fourth opening H4, and a first semiconductor single crystal 20a may start to grow from a region exposed to the first opening H1 on the substrate 11 through the second opening H2 and the third opening H3 so that the first semiconductor single crystal 20a may grow from the first opening H1 to the second opening H2, as illustrated in FIG. 3. The first semiconductor single crystal 20a may have a lattice mismatch with the substrate 11, and crystal defects D may thus occur in the growth process, thereby spreading in a growth direction (e.g., in a direction substantially the same as the direction in which the first semiconductor single crystal 20a grows). For example, a portion of the crystal defects D may progress toward the second opening H2.

Figure 4:
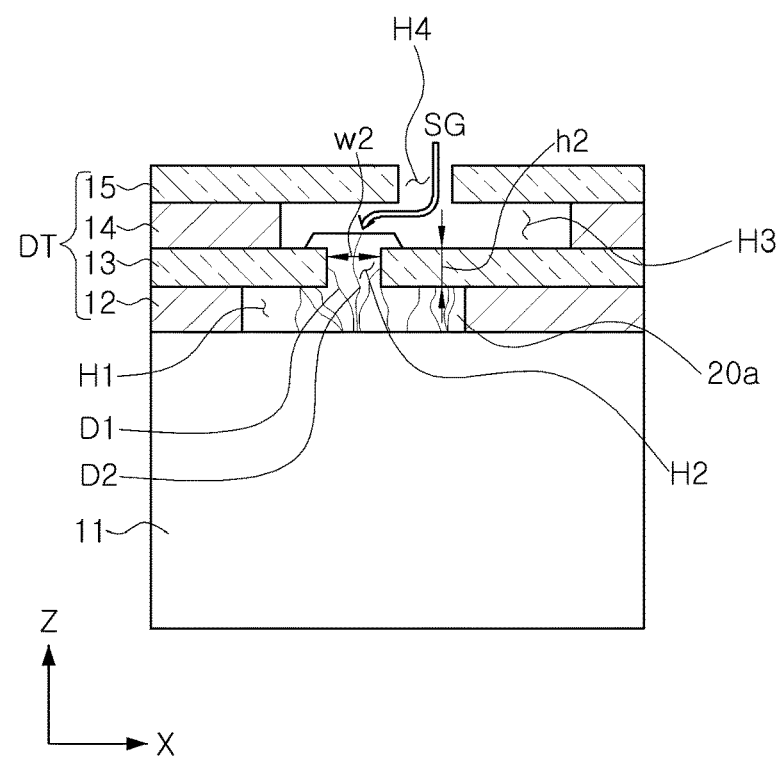

As illustrated in FIG. 4, the source gas SG may continue to be supplied, and the first semiconductor single crystal 20a may be grown along the second opening H2, extending into the third opening H3. In such a growth process, aspect ratio trapping (ART) of the second opening H2 may allow many potential defects D1 that have spread in an inclined direction to be blocked by an internal side wall of the second opening H2. For example, a portion of the crystal defects D (e.g., potential defects D1) may spread in a non-perpendicular direction that prevents the potential defects D1 from spreading through the second opening H2. The second opening H2 may have an aspect ratio of about 2:1 or more representing a height of the second opening H2 to a width of the second opening H2. The second opening H2 is not limited thereto, and the width w2 of the second opening H2 may be from 5 nm to 500 nm, and a height h2 of the second opening H2 may be from 10 nm to 2.5 μm. The height h2 of the second opening H2 may be correspond to the thicknesses of the second dielectric layer 13.

In other exemplary embodiments, the second opening H2 may be designed to have a size thereof less than that under a condition for common ART (aspect ratio trapping) so that a high quality seed crystal, such as a seed crystal of an ingot, may be obtained. For example, the width w2 of the second opening H2 may be from 5 nm to 50 nm, and the height h2 of the second opening H2 may be from 10 nm to 500 nm. In such an ART process, a portion of potential defects D2 that has spread in a vertical direction or closely to the vertical direction may progress along the first semiconductor single crystal 20a grown through the second opening H2.

Figure 5:
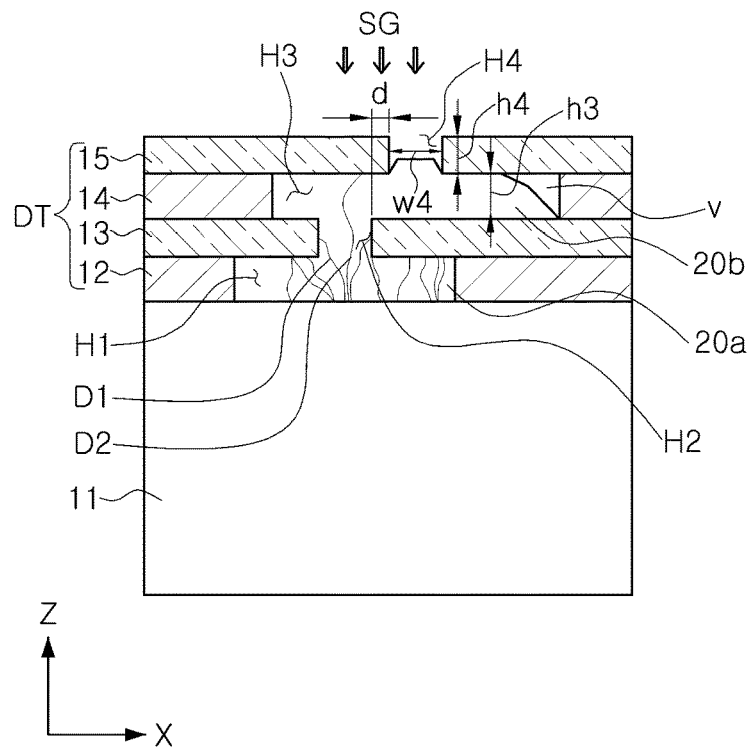

As illustrated in FIG. 5, the first semiconductor single crystal 20a grown from the first opening H1 and the second opening H2 may be grown laterally (e.g., along a direction parallel to a top surface of the substrate 11) in the third opening H3. A second semiconductor single crystal 20b grown on the first semiconductor single crystal 20a in such a manner may develop toward the fourth opening H4. For example, may develop under an epitaxial lateral overgrowth (ELO) condition in the third opening H3, growing toward the fourth opening H4.

In such a growth process, the fourth opening H4 may be positioned to not overlap the second opening H2, and the potential defect D2 that has spread substantially in the vertical direction through the second opening H2 may be blocked by the fourth dielectric layer 15 without passing up to the fourth opening H4.

As in the example embodiments, the second opening H2 and the fourth opening H4 may be disposed to be spaced apart or offset from each other at a regular interval d in the horizontal direction relative to a top surface of the substrate 11 (e.g., an X- and/or Y-direction). The interval d between the second opening H2 and the fourth opening H4 in the horizontal direction may be determined to be 40% or more of a height h3 of the third opening H3 (e.g., a thickness of the third dielectric layer 14) relative to a direction (e.g., an angle) in which a crystal defect is desired to be blocked by the third opening H3. For example, the interval d between the second opening H2 and the fourth opening H4 in the horizontal direction may be from 10 nm to 1 μm.

A second semiconductor single crystal 20b grown in the present process may not fully fill the third opening H3, leaving a portion of the third opening H3 vacant or empty. As illustrated in FIG. 5, the second opening H2 may be positioned on a side of the third opening H3, and a region of the third opening H3 far away from the second opening H2 may remain a void v. The quality of a subsequent crystal may be determined by the second semiconductor single crystal 20b grown through the fourth opening H4, and even in a case in which the void v exists in the third opening H3, the quality of the subsequent crystal may thus not be adversely affected.

Figure 6:
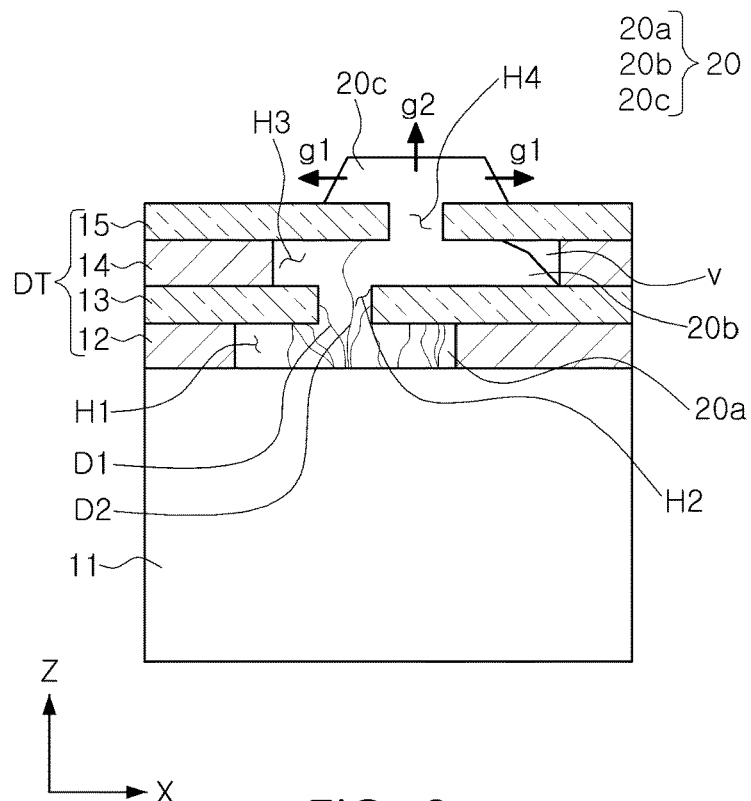

As illustrated in FIG. 6, the second semiconductor single crystal 20b grown from the third opening H3 may grow up to an upper surface of the fourth dielectric layer 15 through the fourth opening H4. A third semiconductor single crystal 20c grown from the upper surface of the fourth dielectric layer 15 may develop under an epitaxial lateral overgrowth (ELO) condition, similar to the growth of the second semiconductor single crystal 20b in the third opening H3. In an initial process, the third semiconductor single crystal 20c may be grown to be much larger in a lateral growth direction or mode g1 than in a vertical growth direction or mode g2 to merge with another third semiconductor single crystal 20c adjacent to the third semiconductor single crystal 20c on a surface of the fourth dielectric layer 15 and grown from another fourth opening H4, thereby providing a flat layer.

Before the growth of the third semiconductor single crystal 20c from the upper surface of the fourth dielectric layer 15, the fourth opening H4 may provide an additional ART effect. The ART effect resulting from the fourth opening H4 may cause a crystal defect that may occur in the third opening H3 to be prevented or trapped in the fourth opening H4 and not spread further upper portions of the single crystal 20c. Similar to the second opening H2, the fourth opening H4 may have an aspect ratio of 2:1 or more.

After the growth of the semiconductor single crystal 20 and before the manufacturing of a device using the semiconductor single crystal 20, an additional process may be introduced. For example, a process of planarizing an upper surface of the semiconductor single crystal 20 disposed on the fourth dielectric layer 15 may be further included. In some embodiments, after semiconductor single crystals 20c adjacent to each other merge with each other, an additional polishing process may be applied thereto so that the upper surface of the merged semiconductor single crystals 20c may have a higher degree of flatness. For example, additional processing may provide a uniform, planar top surface.

In another example embodiment, after the growth of the semiconductor single crystal 20, the whole or a part of the first to fourth dielectric layers 12, 13, 14, and 15 may be removed from the semiconductor single crystal 20 positioned on the fourth dielectric layer 15. For example, in order to obtain a wafer that is the semiconductor single crystal 20, the semiconductor single crystal 20 disposed on the fourth dielectric layer 15 may be grown with a sufficient thickness, and the defect trapping stack DT may then be eliminated from the semiconductor single crystal 20.

In the example embodiments, the first to fourth openings H1, H2, H3, and H4 may be exemplified as having a substantially circular shape as illustrated in FIG. 2, but the embodiments are not limited thereto. An opening employable in the defect trapping stack DT may have various shapes, such as, for example, the shapes illustrated in FIGS. 7 and 8.

FIGS. 7 and 8 are plan views illustrating opening patterns of other defect trapping stacks DT employable in the exemplary semiconductor single crystal structure of FIG. 1. When viewed in a cross-sectional view, the opening patterns illustrated in FIGS. 7 and 8 may be appear similar to that of the cross-sectional view illustrated in FIG. 1.

Referring to FIG. 7, a first opening H1' and a second opening H2' each may be illustrated by dotted lines, and a third opening H3' and a fourth opening H4' each may be illustrated by solid lines. The first to fourth openings H1', H2', H3', and H4' employed in the example embodiments may have stripe shapes, respectively. For example, the first to fourth openings H1', H2', H3', and H4' may be shaped as strips. The second opening H2' and the fourth opening H4' may be disposed substantially in the centers of the first opening H1' and the third opening H3', respectively. Similar to the previous example embodiment, the fourth opening H4' may be disposed to be spaced apart from the second opening H2' at a predetermined interval d without overlapping the second opening H2'.

Referring to FIG. 8, a first opening H1" and a second opening H2" each may be illustrated by dotted lines, and a third opening H3" and a fourth opening H4" each may be illustrated by solid lines. The first to fourth openings H1", H2", H3", and H4" may have quadrangular shapes, respectively. The second opening H2" and the fourth opening H4" may be disposed substantially in the centers of the first opening H1" and the third opening H3", respectively. Similar to the previous example embodiment, the fourth opening H4" may be disposed to be spaced apart from the second opening H2" at a predetermined interval d without overlapping the second opening H2".

A defect trapping stack DT employed in the example embodiments may be formed by various types of processes. As an example of a process of manufacturing a defect trapping stack DT, FIGS. 9 through 14 illustrate cross-sectional views of exemplary processes. For convenience of description in the following example embodiment, the terms "second opening" (e.g., H2, H2', H2") and "fourth opening" (e.g., H4, H4', H4") described in the previous example embodiments, may be changed to "first trapping opening" and "second trapping opening", respectively, and the terms "first opening" (e.g., H1, H1', H1") and "third opening" (e.g., H3, H3', H3") may be changed to "growth opening" and "connecting opening", respectively.

Figure 9:
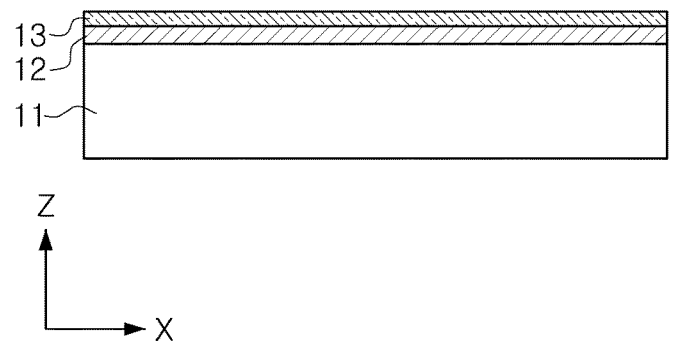
FIGS. 9 through 14 are cross-sectional views illustrating a process of manufacturing a defect trapping stack, respectively.

As illustrated in FIG. 9, a first dielectric layer 12 and a second dielectric layer 13 may be sequentially formed on a substrate 11.

The substrate 11 may include silicon (Si), germanium (Ge), and sapphire ($Al_2O_3$). For example, when the substrate 11 is formed of Si, a plane of Si may be used as a crystal growth surface. The first dielectric layer 12 and the second dielectric layer 13 may include materials having respectively different etching selectivity ratios under a certain etching process condition. The first dielectric layer 12 and the second dielectric layer 13 are not limited thereto, and may be a silicon oxide ($SiO_2$), a silicon nitride ($Si_3N_4$), or an aluminum oxide ($Al_2O_3$). For example, the first dielectric layer 12 may be $SiO_2$ or $Si_3N_4$, and the second dielectric layer 13 may be $SiO_2$ or $Si_3N_4$.

Thicknesses of the first dielectric layer 12 and the second dielectric layer 13 may be determined taking into consideration heights of openings H1 and H2 that will be formed in the following exemplary process. For example, the thickness of the second dielectric layer 13 may be from 10 nm to 2.5 μm. In some embodiments, the thickness of the second dielectric layer 13 may be from 10 nm to 500 nm. Similar to the second dielectric layer 13, the thickness of the first dielectric layer 12 may also be from 10 nm to 2.5 μm.

Figure 10:
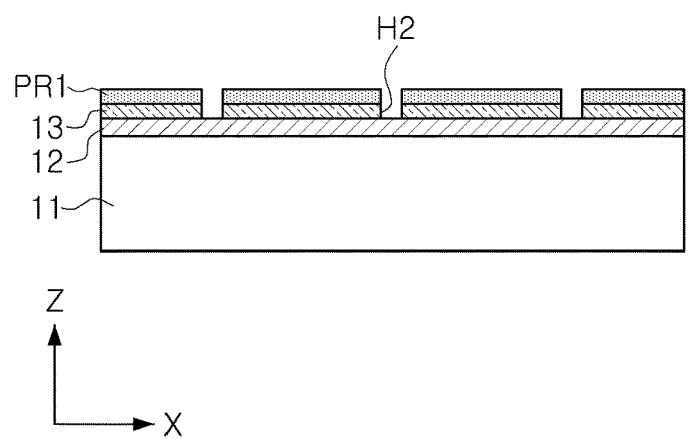

As illustrated in FIG. 10, first trapping openings H2 may be formed in the second dielectric layer 13 so that portions of the first dielectric layer 12 may be exposed.

A first photomask PR1 may be formed on the second dielectric layer 13, and may be patterned to have openings in positions corresponding to those of the first trapping openings H2. Portions of the second dielectric layer 13 exposed to the openings of the first photomask PR1 may be selectively removed to form the first trapping openings H2. The present etching condition may include the second dielectric layer 13 formed of a material having a high etching selectivity ratio, but the first trapping opening H2 may be formed by adjusting an etching depth thereof using an anisotropic etching process such as reactive ion etching (RIE). In such an etching process, the portions of the first dielectric layer 12 may be removed.

A width of the first trapping opening H2 may be set to have an aspect ratio of about 2.0 or more in order to improve the ART effect described above. For example, the first trapping opening H2 may have a width of 5 nm to 500 nm. In some embodiments, the first trapping opening H2 may have a width of 5 nm to 50 nm.

Figure 11:
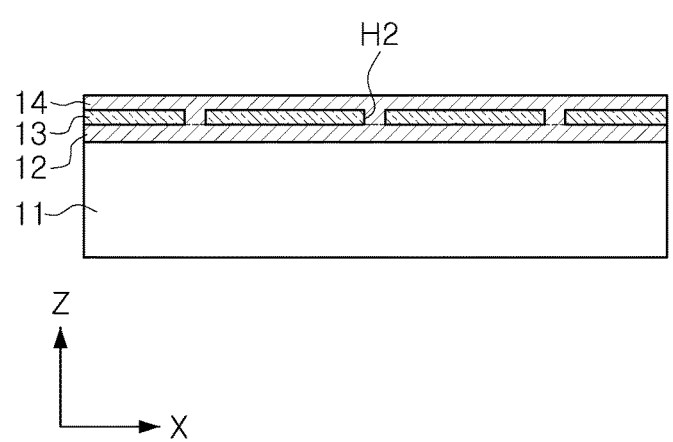

As illustrated in FIG. 11, a third dielectric layer 14 may be formed on the second dielectric layer 13.

In a process of depositing the third dielectric layer 14, the first trapping opening H2 of the second dielectric layer 13 may also be filled with the third dielectric layer 14. Similar to the material of the first dielectric layer 12, a material of the third dielectric layer 14 may have a high etching selectivity ratio compared to the material of the second dielectric layer 13. For example, the third dielectric layer 14 may be formed of the same material as that of the first dielectric layer 12. The material provided in the first trapping opening H2 may be the same or similar to the material of the first dielectric layer 12, and may thus be removed along with the first dielectric layer 12 and/or the third dielectric layer 14 when the first dielectric layer 12 and/or the third dielectric layer 14 are/is selectively removed.

Figure 12:
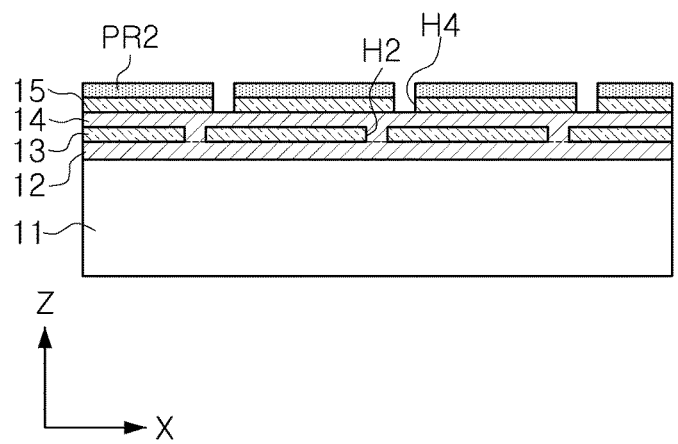

As illustrated in FIG. 12, a fourth dielectric layer 15 may be formed on the third dielectric layer 14, and second trapping openings H4 may be formed in the fourth dielectric layer 15 to not overlap the first trapping openings H2.

Similar to the material of the second dielectric layer 13, a material of the fourth dielectric layer 15 may have a high etching selectivity ratio compared to the material of the third dielectric layer 14. For example, the fourth dielectric layer 15 may be formed of the same material as that of the second dielectric layer 13. A second photomask PR2 may be formed on the fourth dielectric layer 15, and may be patterned to have openings in positions corresponding to those of the second trapping openings H2. Portions of the fourth dielectric layer 15 exposed to the openings of the second photomask PR2 may be selectively removed to form the second trapping openings H4. Similar to the process described in FIG. 10, the present etching process may include an etching process having a high etching selectivity ratio as well as an anisotropy etching process such as RIE.

The positions of the second trapping openings H4 may not overlap those of the first trapping openings H2 in a vertical direction. Such an arrangement in which the second trapping openings H4 and the first trapping openings H2 do not overlap each other may cause a crystal defect that has spread in a substantially vertical direction to be effectively prevented. The first trapping opening H2 and the second trapping opening H4 may be disposed to be spaced apart from each other at regular intervals in a horizontal direction relative to a top surface of the substrate 11 (e.g., an X- and/or Y-direction). For example, when viewed in a plan view, the second trapping openings H4 may be spaced apart from the first trapping openings H2. In some embodiments, an interval between the first trapping opening H2 and the second trapping opening H4 in the horizontal direction may be from 10 nm to 1 μm. Similar to the first trapping opening H2, the second trapping opening H4 may have an aspect ratio of 2:1 or more for a self defect trapping effect.

Figure 13:
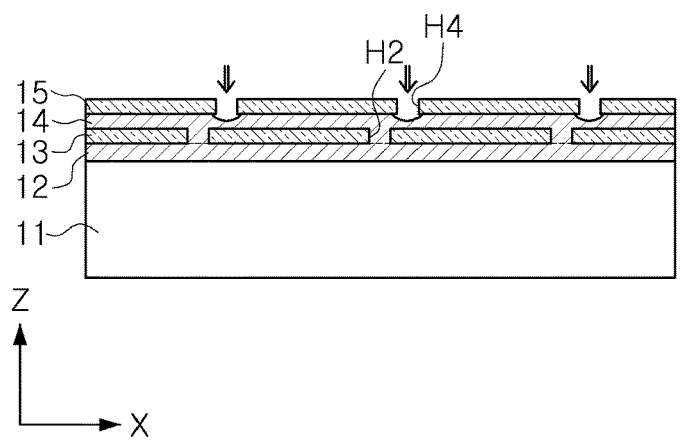

As illustrated in FIG. 13, the second trapping opening H4 may allow the third dielectric layer 14 and the first dielectric layer 12 to be selectively etched therethrough.

The present etching may be performed under a condition in which a high etching selectivity ratio compared to the first dielectric layer 12 and the third dielectric layer 14 may be satisfied as compared to the second dielectric layer 13 and the fourth dielectric layer 15. In the process of selectively etching the first dielectric layer 12 and the third dielectric layer 14, the second dielectric layer 13 and the fourth dielectric layer 15 each may substantially act as an etching stopper. As described above, the first dielectric layer 12 and the third dielectric layer 14 may include a first material ($SiO_2$ or $Si_3N_4$) in order to perform the selective etching process. The second dielectric layer 13 and the fourth dielectric layer 15 may include a second material ($Si_3N_4$ or $SiO_2$) having a high etching selectivity ratio compared to the first material under a certain etching process condition.

Figure 14:
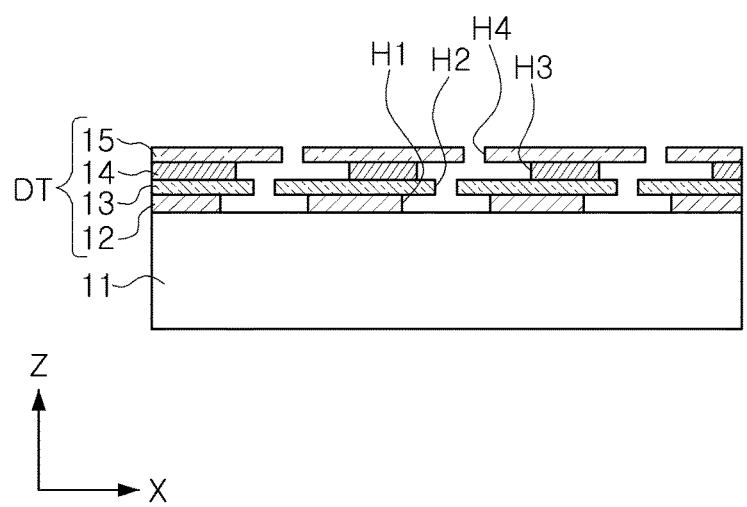

As illustrated in FIG. 14, an etchant may continue to be injected into the second trapping openings H4 so that connecting openings H3 respectively extending to the first trapping openings H2 may be formed in the third dielectric layer 14, and growth openings H1 exposing portions of the substrate 11 may then be formed in the first dielectric layer 12 while the first trapping openings H2 are opened.

In the example embodiments, the first trapping opening H2 and the second trapping opening H4 may be used as etching gas injection holes for forming the growth opening H1 and the connecting opening H3, respectively. Therefore, when being applied to isotropic etching, the first trapping opening H2 and the second trapping opening H4 may be disposed substantially at the centers of the growth opening H1 and the connecting opening H3, respectively. In the process of forming the connecting opening H3, the connecting opening H3 may also then continue to be etched in the etching process of forming the growth opening H1, and the growth opening H1 may start to be formed while the material provided in the first trapping opening H2 is removed. As a result, when the first dielectric layer 12 and the third dielectric layer 14 include the same or similar material as each other, a size (or a volume) of the connecting opening H3 may be greater than that (or a volume) of the growth opening H1.

Subsequently, as illustrated in FIGS. 3 through 6, the semiconductor single crystal 20 having a lattice mismatch with a crystal of the substrate 11 may be grown on the substrate 11 provided with such a defect trapping stack DT. In such a process, as illustrated in FIG. 1, the semiconductor single crystal 20 may extend from a region of the substrate 11 defined in the growth opening H1 to the upper surface of the fourth dielectric layer 15 through the growth opening H1, the first trapping opening H2, the connecting opening H3, and the second trapping opening H4.

The semiconductor single crystal 20 may be used to manufacture a semiconductor device. In particular, the semiconductor single crystal 20 may provide a high quality single compound semiconductor crystal having reduced crystal defects, and the high quality single compound semiconductor crystal may be used in a semiconductor device (for example, a MOSFET) used as an active layer, such as a channel region.

Figure 15:
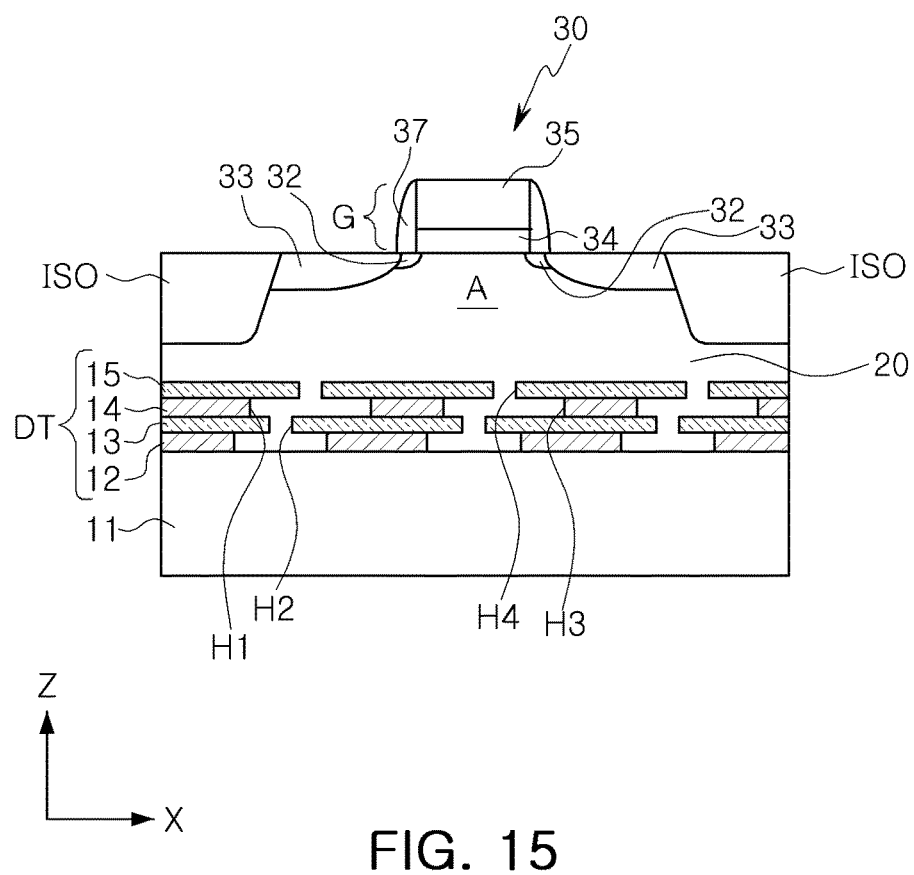
FIG. 15 is a schematic cross-sectional view of a semiconductor device according to an example embodiment.

FIG. 15 is a cross-sectional view of a MOSFET device as an example of a semiconductor device according to an example embodiment.

Referring to FIG. 15, a MOSFET device 30 according to the example embodiment may include a substrate 11, a defect trapping stack DT provided on the substrate 11, and a semiconductor single crystal 20.

The semiconductor single crystal 20 may have device isolation regions ISO defining an active region A with a certain depth. In the active region A of the semiconductor single crystal 20, an n-type well may be formed by using an impurity such as phosphorus (P) or arsenic (As) in the case of an n-MOSFET, and a p-type well may be formed by using an impurity such as boron (B) in the case of a p-MOSFET. In the case of a complementary MOSFET, the present process may allow a first well and a second well having different conductivity types to be formed, and a MOSFET region as a device isolation region ISO to be divided into two.

The MOSFET device 30 may include a gate structure G disposed on the active region A, and the gate structure G may include a gate insulating film 34 and a gate electrode 35. Side wall spacers 37 may be disposed on side walls of the gate structure G, respectively. The side wall spacers 37 may have low-concentration doped regions 32 provided therebelow, and may have high-concentration doped regions 33 provided thereoutside by additional doping. For example, low-concentration doped regions 32 may be disposed beneath the side wall spacers 37, and high-concentration doped regions 33 may be disposed adjacent to the low-concentration doped regions 32.

For example, the substrate 11 may be provided as a silicon substrate, and the semiconductor single crystal 20 may be formed of SiGe. According to example embodiments, the semiconductor single crystal 20 may be provided as a high quality crystal with crystal defects significantly reduced by the defect trapping stack DT while being grown in a heterojunction growth manner. As a result, a reliability issue such as leakage current in the active region A may be minimized or resolved.

A defect trapping stack DT may be provided in various shapes. FIGS. 16, 17, 18, and 20 illustrate semiconductor single crystal structures in which respectively different shapes of defect trapping stacks are employed. FIG. 19 is a schematic plan view corresponding to the defect trapping stack DT of FIG. 18.

Figure 16:
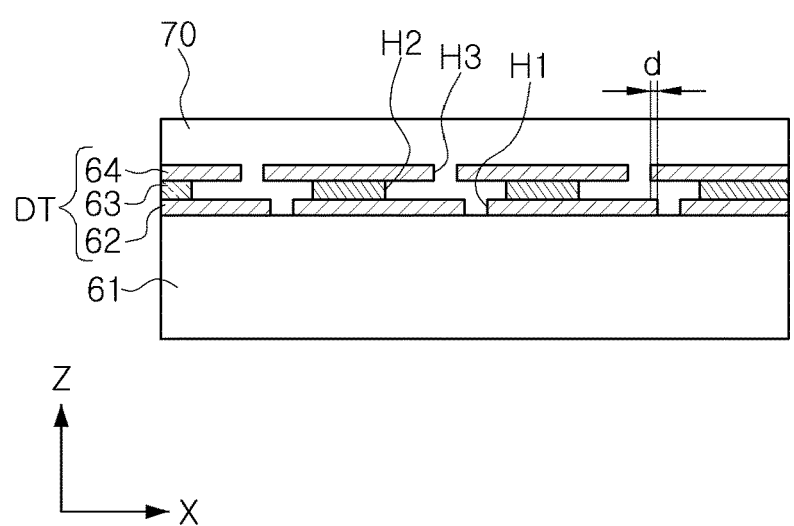
FIG. 16 is a schematic cross-sectional view of a semiconductor single crystal structure according to an example embodiment.

FIG. 16 is a schematic cross-sectional view of a semiconductor single crystal structure according to an example.

Referring to FIG. 16, the semiconductor single crystal structure may include a substrate 61, a defect trapping stack DT disposed on the substrate 61, and a semiconductor single crystal 70 disposed on the defect trapping stack DT.

The semiconductor single crystal 70 may have a lattice mismatch with a crystal of the substrate 61. For example, the substrate 61 may include silicon (Si), germanium (Ge), and sapphire ($Al_2O_3$). The semiconductor single crystal 70 may include a compound semiconductor such as SiGe, or a III-V group compound semiconductor such as GaAs, InGaAs, InAs, InSb, or GaN.

A defect trapping stack DT employed in the example embodiment may include first to third dielectric layers 62, 63, and 64 sequentially disposed on the substrate 61. The first to third dielectric layers 62, 63, and 64 may include first trapping openings H1, connecting openings H2, and second trapping openings H3, each of which is formed in a repeating pattern. The defect trapping stack DT illustrated in FIG. 16 may differ from the defect trapping stack DT illustrated in FIG. 1 in that growth openings may not be provided, and the first trapping opening H1 may be directly disposed on the substrate 61.

In the example embodiment, the first trapping opening H1 employed for ART may be disposed on the substrate 61 to define a region on which the semiconductor single crystal 70 will be grown on an upper surface of the substrate 61. The first trapping opening H1 may have an aspect ratio of about 2.0 or more so that an internal side wall thereof may effectively block potential defects that have spread in a growth direction of the semiconductor single crystal 70 (e.g., a direction inclined relative to the upper surface of the substrate 61).

The connecting opening H2 of the second dielectric layer 63 may be positioned on the first trapping opening H1, and may have a width greater than that of the first trapping opening H2. The second trapping opening H3 of the third dielectric layer 64 may be positioned on the connecting opening H2. As illustrated in FIG. 16, the second trapping opening H3 may be positioned substantially at the center of the connecting opening H2.

In the example embodiment, the second dielectric layer 63 may be formed of a material having a high etching selectivity ratio compared to that of the first dielectric layer 62 and the third dielectric layer 64 under a certain etching process condition.

The connecting opening H2 may provide a void connecting the first trapping opening H1 to the second trapping opening H3. A semiconductor single crystal grown from the first trapping opening H1 may be developed in the second trapping opening H3 while expanding in the connecting opening H2 in a lateral direction thereof (e.g., expanding laterally to the sidewalls of the connecting opening H2).

The second trapping opening H3 may have a width less than that of the connecting opening H2, and may be positioned to not overlap the first trapping opening H1. As such, an arrangement in which the second trapping opening H3 and the first trapping opening H1 do not overlap each other may cause a crystal defect that has spread in a substantially vertical direction to be effectively blocked or prevented from continuing to spread.

Thus, in the example embodiment, along with an ART effect obtained by the first trapping opening H1 and the second trapping opening H3, the arrangement in which the two trapping openings, the first trapping openings H1 and the second trapping openings H3, do not overlap each other may effectively reduce a crystal defect that has spread in a substantially vertical direction and to increase crystallinity of the semiconductor single crystal 70.

Figure 17:
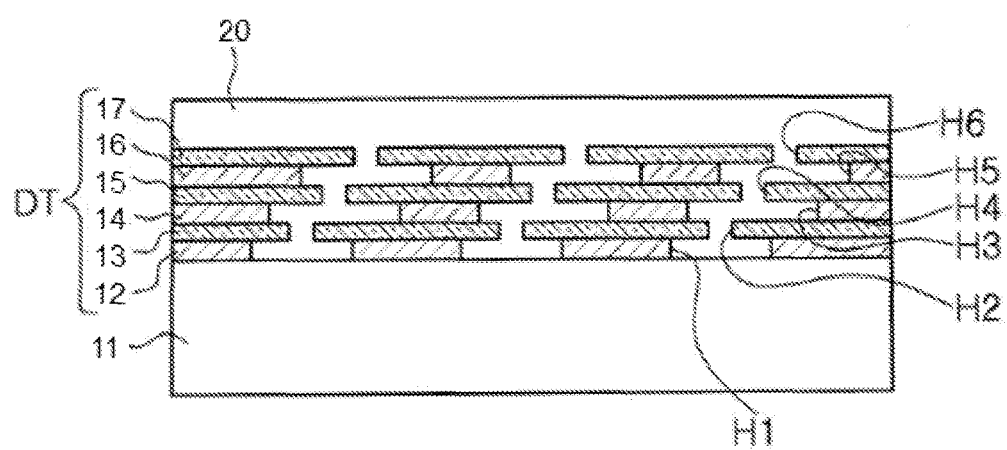
FIG. 17 is a schematic cross-sectional view of a semiconductor single crystal structure according to an example embodiment.

FIG. 17 is a schematic cross-sectional view of a semiconductor single crystal structure according to an example embodiment.

The semiconductor single crystal structure illustrated in FIG. 17 may include a defect trapping stack DT having six dielectric layers, unlike the example embodiment illustrated in FIG. 1 having four dielectric layers.

For example, the defect trapping stack DT employed in the example embodiment of FIG. 17 may further include a fifth dielectric layer 16 disposed on a fourth dielectric layer 15 and having fifth openings H5, and a sixth dielectric layer 17 disposed on the fifth dielectric layer 16 and having sixth openings H6, as compared to the example embodiment illustrated in FIG. 1.

The fifth openings H5 may be positioned on the fourth openings H4, and may have a width greater than that of the fourth openings H4. The sixth opening H6 may be positioned on the fifth openings H5, and may have a width less than that of the fifth openings H5. Similar to the second openings H2 and the fourth openings H4, the sixth openings H6 may be provided as a trapping opening, and may not overlap the fourth openings H4, so that a crystal defect that has spread in a vertical direction may be additionally blocked.

Figure 18:
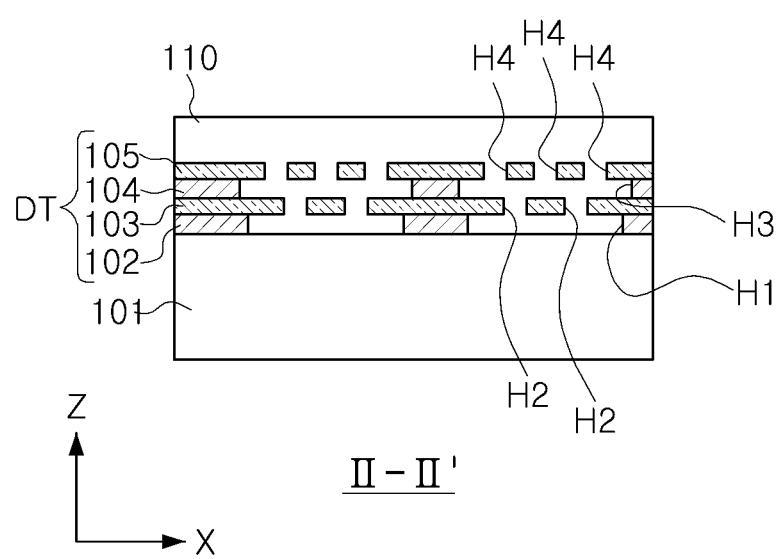
FIG. 18 is a schematic cross-sectional view of a semiconductor single crystal structure according to an example embodiment.
Figure 19:
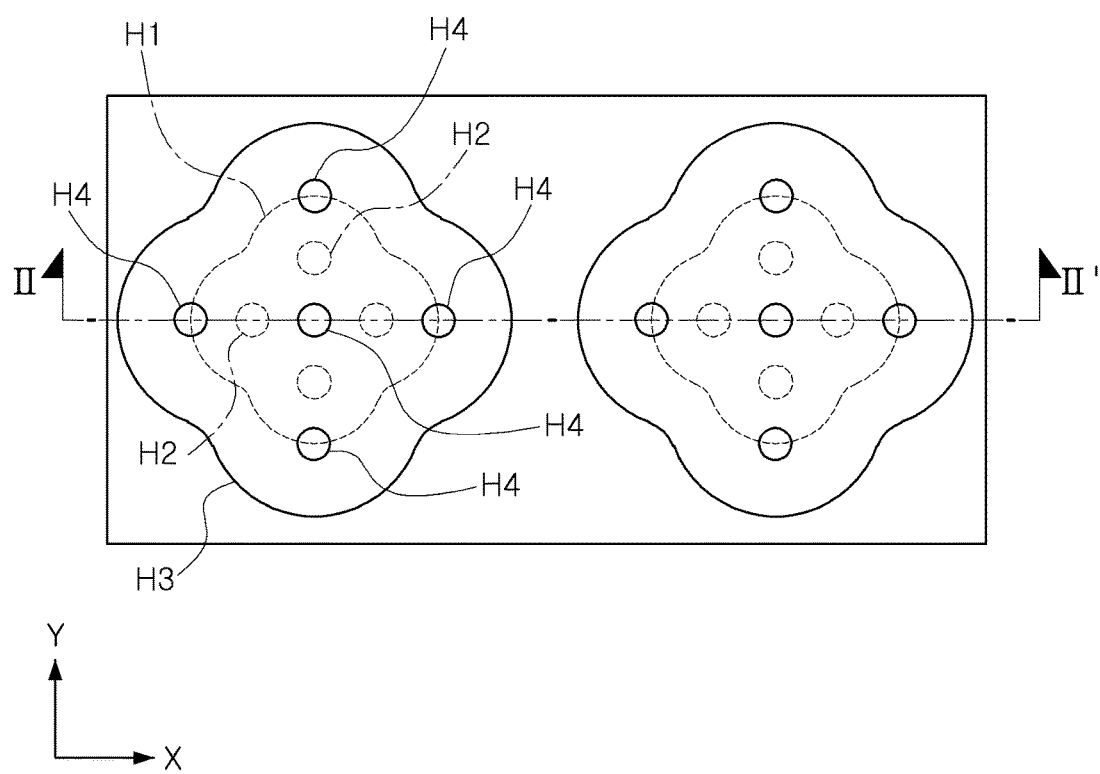
FIG. 19 is a schematic view illustrating an opening pattern of a defect trapping stack employed in FIG. 18.

FIG. 18 is a schematic cross-sectional view of a semiconductor single crystal structure according to an example embodiment.

The semiconductor single crystal structure illustrated in FIG. 18 may include a substrate 101, a defect trapping stack DT disposed on the substrate 101, and a semiconductor single crystal 110 disposed on the defect trapping stack DT. The semiconductor single crystal 110 may have a lattice mismatch with a crystal of the substrate 101.

The defect trapping stack DT may include first to fourth dielectric layers 102, 103, 104, and 105 sequentially disposed on the substrate 101. The first to fourth dielectric layers 102, 103, 104, and 105 may include first to fourth openings H1, H2, H3, and H4, respectively.

In the example embodiment, the second openings H2 and the fourth openings H4, which are connected to a single third opening H3, are provided in plural. For example, as illustrated in FIG. 19, a single third opening H3 may be connected to two second openings H2 and three fourth openings H4. The second openings H2 connected to a single first opening H1 may also be provided in plural. For example, the single first opening H1 may be connected to two second openings H2.

FIG. 19 is a schematic plan view illustrating an example of the defect trapping stack DT employed in FIG. 18, and illustrates an opening pattern of the defect trapping stack DT. In FIG. 19, the first openings H1 and the second openings H2 are illustrated by dotted lines, and the third openings H3 and the fourth openings H4 are illustrated by solid lines.

Referring to FIGS. 18 and 19, the first opening H1 of the first dielectric layer 102 may define a region on which the semiconductor single crystal 110 will be grown on an upper surface of the substrate 101. The second openings H2 of the second dielectric layer 103 may be disposed on the first opening H1 to be connected to the first opening H1. As illustrated in FIG. 19, each of four second openings H2 may be arranged on the first opening H1 at regular intervals in horizontal/vertical directions relative to a top surface of the substrate 101 (e.g., an X- and/or Y-direction). Each of the second openings H2 may have a width less than that of the first opening H1. In some embodiments, the multiple second openings H2 connected to the same first opening H1 may collectively have a width less than that of the first opening H1. For an ART effect, each of the second openings H2 may have an aspect ratio of about 2.0 or more.

The third opening H3 of the third dielectric layer 104 may be disposed on the second openings H2 to be connected to the second openings H2. Similarly, the fourth openings H4 of the fourth dielectric layer 105 may be disposed on the third opening H3 to be connected to the third opening H3. The third opening H3 may have a width greater than that of the second openings H2 and the fourth openings H4. In some embodiments, the third opening H3 may have a width greater than the combined widths of the multiple second openings H2 to which it is connected, and a width greater than the combined widths of the multiple fourth openings H4 to which it is connected. As illustrated in FIG. 19, each of five fourth openings H4 may be arranged on the third opening H3 to have a regular interval in the horizontal/vertical directions relative to a top surface of the substrate 101 (e.g., an X- and/or Y-direction).

In the example embodiment, the fourth openings H4 may be positioned to not overlap the second openings H2. In some embodiments, the fourth openings H4 connected to a single third opening H3 may be disposed to be offset from each of the second openings H2 connected to the same single third opening H3. As such, an arrangement in which the second openings H2 and the fourth openings H4 do not overlap each other may cause a crystal defect that has spread in a substantially vertical direction to be effectively blocked or prevented from continuing to spread, so that a high quality semiconductor single crystal 110 may be obtained.

Figure 20:
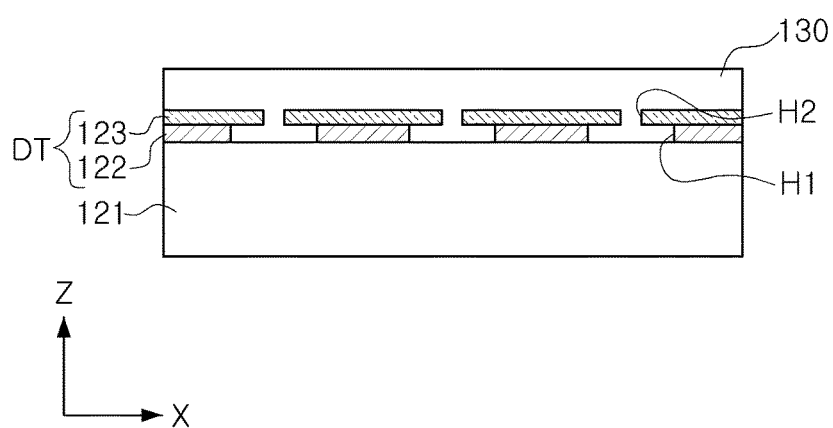
FIG. 20 is a schematic cross-sectional view of a semiconductor single crystal structure according to an example embodiment.

FIG. 20 is a schematic cross-sectional view of a semiconductor single crystal structure according to an example embodiment.

Referring to FIG. 20, the semiconductor single crystal structure may include a substrate 121, a defect trapping stack DT disposed on the substrate 121, and a semiconductor single crystal 130 disposed on the defect trapping stack DT. The semiconductor single crystal 130 may have a lattice mismatch with a crystal of the substrate 121.

The defect trapping stack DT may include a first dielectric layer 122 and a second dielectric layer 123 sequentially disposed on the substrate 121. The first dielectric layer 122 and the second dielectric layer 123 may include first openings H1 and second openings H2, respectively. The first opening H1 as a growth opening may define a growth region on the substrate 121. The second opening H2 as a trapping opening may have a width less than that of the first opening H1, and may have an aspect ratio of about 2.0 or more so that an internal side wall thereof may effectively block potential defects that have spread in a growth direction of the semiconductor single crystal 130 (in particular, a direction inclined relative to an upper surface of the substrate 121). The second opening H2 is not limited thereto. For example, the second opening H2 may have a width of 5 nm to 500 nm and a height of 10 nm to 2.5 μm.

In particular, the example embodiment may allow the second opening H2 to be designed to have a size less than that under a condition for common ART so that a high quality seed crystal may be grown. For example, in some embodiments, the second openings H2 may have a width of 5 nm to 50 nm, and may further have a width of 10 nm to 500 nm.

As set forth above, according to example embodiments, crystal defects of a single heterojunction semiconductor crystal may be significantly reduced by using opening patterns provided to a plurality of dielectric layers stacked on each other. Further, a semiconductor device having improved reliability may be provided by using a high-quality single heterojunction semiconductor crystal.

While exemplary embodiments have been shown and described above, it will be apparent to those skilled in the art that modifications and variations could be made without departing from the scope of the present inventive concepts as defined by the appended claims.

What is claimed is:

1. A semiconductor single crystal structure comprising:
a substrate;
a defect trapping stack disposed on the substrate; and
a semiconductor single crystal disposed on the defect trapping stack, and having a lattice mismatch with a crystal of the substrate,
wherein the defect trapping stack includes:
a first dielectric layer disposed on the substrate and having at least one first opening, the at least one first opening having a first width,
a second dielectric layer disposed on the first dielectric layer and having at least one second opening positioned on the at least one first opening, the at least one second opening having a second width less than the first width,
a third dielectric layer disposed on the second dielectric layer and having at least one third opening positioned on the at least one second opening, the at least one third opening having a third width greater than the second width, and
a fourth dielectric layer disposed on the third dielectric layer and having at least one fourth opening positioned on the at least one third opening while not overlapping the at least one second opening, the at least one fourth opening having a fourth width less than the third width, and
wherein the semiconductor single crystal extends to a region of the substrate defined by the at least one first opening through the at least one fourth opening, the at least one third opening, the at least one second opening, and the at least one first opening.

2. The semiconductor single crystal structure of claim 1, wherein the at least one second opening has an aspect ratio of 2:1 or more.

3. The semiconductor single crystal structure of claim 2, wherein the second width of the at least one second opening is from 5 nm to 500 nm, and a second height of the at least one second opening is from 10 nm to 2.5 μm.

4. The semiconductor single crystal structure of claim 2, wherein an interval measured in a first direction between the at least one second opening and the at least one fourth opening is 40% or more of a third height of the at least one third opening.

5. The semiconductor single crystal structure of claim 2, wherein an interval measured in a first direction between the at least one second opening and the at least one fourth opening is from 10 nm to 1 μm.

6. The semiconductor single crystal structure of claim 1, wherein the at least one fourth opening has an aspect ratio of 2:1 or more.

7. The semiconductor single crystal structure of claim 1, wherein the first dielectric layer and the third dielectric layer include a first material, and the second dielectric layer and the fourth dielectric layer include a second material different from the first material.

8. The semiconductor single crystal structure of claim 1, wherein the at least one second opening is positioned substantially above a center of the at least one first opening.

9. The semiconductor single crystal structure of claim 1, wherein the at least one fourth opening is positioned substantially above a center of the at least one third opening.

10. The semiconductor single crystal structure of claim 1, wherein a third size of the at least one third opening is greater than a first size of the at least one first opening.

11. The semiconductor single crystal structure of claim 1, wherein a portion of the at least one third opening has a void not filled with the semiconductor single crystal.

12. The semiconductor single crystal structure of claim 1, wherein at least one of the at least one second opening and the at least one fourth opening is connected to one of the at least one third opening and is provided in plural.

13. The semiconductor single crystal structure of claim 1, wherein the at least one second opening is connected to one of the at least one first opening and is provided in plural.

14. The semiconductor single crystal structure of claim 1, wherein the defect trapping stack further includes:
a fifth dielectric layer disposed on the fourth dielectric layer and having at least one fifth opening positioned on the at least one fourth opening, the at least one fifth opening having a fifth width greater than the fourth width, and
a sixth dielectric layer disposed on the fifth dielectric layer and having at least one sixth opening positioned on the at least one fifth opening, the at least one sixth opening having a sixth width less than the fifth width without overlapping the at least one fourth opening, and
wherein the semiconductor single crystal is disposed on an upper surface of the sixth dielectric layer, and extends through the at least one sixth opening and the at least one fifth opening.

15. The semiconductor single crystal structure of claim 1, wherein the first to fourth openings are arranged in plural with repeating patterns in the first to fourth dielectric layers, respectively.

16. A semiconductor device comprising:
a substrate;
a first dielectric layer disposed on the substrate and having at least one first opening, the at least one first opening having a first width;
a second dielectric layer disposed on the first dielectric layer and having at least one second opening positioned on the at least one first opening, the at least one second opening having a second width less than the first width;

a third dielectric layer disposed on the second dielectric layer and having at least one third opening positioned on the at least one second opening, and the at least one third opening having a third width greater than the second width;

a fourth dielectric layer disposed on the third dielectric layer and having at least one fourth opening positioned on the at least one third opening without overlapping the at least one second opening, the at least one fourth opening having a fourth width less than the third width; and a semiconductor single crystal disposed on an upper surface of the fourth dielectric layer and extending to a region of the substrate defined by the at least one first opening through the at least one fourth opening, the at least one third opening, the at least one second opening, and the at least one first opening, wherein the semiconductor single crystal has a lattice mismatch with a crystal of the substrate, and wherein first dielectric layer, the second dielectric layer, the third dielectric layer, and the fourth dielectric layer comprise a defect trapping stack.

17. The semiconductor device of claim 16, wherein the semiconductor device is a metal oxide semiconductor field effect transistor (MOSFET) device, and the semiconductor single crystal provides a channel region of the MOSFET device.

18. The semiconductor device of claim 16, wherein the substrate contains silicon (Si), and the semiconductor single crystal includes a Silicon-Germanium (SiGe) compound semiconductor or a III-V group compound semiconductor.

* * * * *